(12) United States Patent
Konrath et al.

(10) Patent No.: US 10,431,698 B2
(45) Date of Patent: Oct. 1, 2019

(54) SEMICONDUCTOR DEVICE WITH NON-OHMIC CONTACT BETWEEN SIC AND A CONTACT LAYER CONTAINING METAL NITRIDE

(71) Applicant: Infineon Technologies Austria AG, Villach (AT)

(72) Inventors: Jens Peter Konrath, Villach (AT); Ronny Kern, Finkenstein (AT); Stefan Krivec, Arnoldstein (AT); Ulrich Schmid, Vienna (AT); Laura Stoeber, Vienna (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/238,213

(22) Filed: Jan. 2, 2019

(65) Prior Publication Data

US 2019/0140111 A1    May 9, 2019

Related U.S. Application Data

(62) Division of application No. 15/865,976, filed on Jan. 9, 2018, now Pat. No. 10,199,514, which is a division
(Continued)

(30) Foreign Application Priority Data

Dec. 17, 2014  (DE) .......................... 10 2014 118 874

(51) Int. Cl.
*H01L 29/872*  (2006.01)
*H01L 29/16*   (2006.01)
(Continued)

(52) U.S. Cl.
CPC ........ *H01L 29/872* (2013.01); *H01L 21/0495* (2013.01); *H01L 29/0619* (2013.01); *H01L 29/1608* (2013.01); *H01L 29/6606* (2013.01); *H01L 29/868* (2013.01); *H01L 29/1602* (2013.01); *H01L 29/2003* (2013.01)

(58) Field of Classification Search
None
See application file for complete search history.

(56) References Cited

U.S. PATENT DOCUMENTS 7,851,831 B2    12/2010  Koyama et al.
8,664,665 B2 *  3/2014   Henning ............... H01L 29/872
                                                       257/77
(Continued)

FOREIGN PATENT DOCUMENTS

JP    S6039870 A    3/1985
JP    S62213158 A   9/1987
(Continued)

*Primary Examiner* — Lex H Malsawma
(74) *Attorney, Agent, or Firm* — Murphy, Bilak & Homiller, PLLC (57) ABSTRACT

According to an embodiment of a semiconductor device, the semiconductor device includes a contact layer in contact with SiC material. The contact layer includes a metal nitride having a nitrogen content in a range of 10 to 50 atomic %. The semiconductor device further includes a non-ohmic contact formed between the SiC material and the contact layer.

20 Claims, 5 Drawing Sheets

Related U.S. Application Data of application No. 14/971,823, filed on Dec. 16, 2015, now abandoned.

(51) Int. Cl.
    *H01L 21/04*     (2006.01)
    *H01L 29/66*     (2006.01)
    *H01L 29/868*    (2006.01)
    *H01L 29/06*     (2006.01)
    *H01L 29/20*     (2006.01)

(56) References Cited

U.S. PATENT DOCUMENTS

| | | |
|---|---|---|
| 9,305,789 B2 | 4/2016 | Donkers et al. |
| 2004/0026687 A1 | 2/2004 | Grupp et al. |
| 2009/0242970 A1 | 10/2009 | Shimizu et al. |
| 2013/0065382 A1 | 3/2013 | Nishio et al. |
| 2013/0292790 A1 | 11/2013 | Minoura et al. |
| 2014/0061671 A1 | 3/2014 | Wada et al. |
| 2014/0306232 A1 | 10/2014 | Donkers et al. |
| 2015/0325667 A1 | 11/2015 | Donkers et al. |

FOREIGN PATENT DOCUMENTS

| | | |
|---|---|---|
| JP | 2006190749 A | 7/2006 |
| JP | 2013120822 A | 6/2013 |

\* cited by examiner

SEMICONDUCTOR DEVICE WITH NON-OHMIC CONTACT BETWEEN SiC AND A CONTACT LAYER CONTAINING METAL NITRIDE

BACKGROUND

Schottky diodes comprising a metal-semiconductor junction are generally used as rectifying devices. In particular, SiC Schottky diodes are increasingly used in the field of power electronics.

It is an object of the present invention to provide an improved semiconductor device comprising a metal-semiconductor junction. Further, it is an object to provide a method of manufacturing such a semiconductor device.

SUMMARY

According to an embodiment, a semiconductor device comprises a semiconductor material having a bandgap larger than 2 eV and less than 10 eV, and a contact layer in contact with the semiconductor material, the contact layer comprising a metal nitride. A non-ohmic contact is formed between the semiconductor material and the contact layer.

According to a further embodiment, a semiconductor device comprises a semiconductor body including a semiconductor material having a bandgap larger than 2 eV and less than 10 eV, and a contact layer in contact with a first surface of the semiconductor body. The contact layer comprises a metal nitride. The contact layer is electrically connected to a first load terminal, and a non-ohmic contact is formed between the semiconductor body and the contact layer. A second surface of the semiconductor body is electrically connected to a second load terminal, the second surface being opposite to the first surface.

According to a further embodiment, a semiconductor device comprises a semiconductor body including a semiconductor material having a bandgap larger than 2 eV and less than 10 eV, and a contact layer in contact with a first surface of the semiconductor body. The contact layer comprises a metal nitride. The contact layer is electrically connected to a first load terminal. A non-ohmic contact is formed between the semiconductor body and the contact layer. A second surface of the semiconductor body is electrically connected to a second load terminal, the second surface being opposite to the first surface.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, diamond, silicon carbide (SiC) or gallium nitride (GaN) may form the semiconductor substrate material.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-resistive electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Figure 1A:
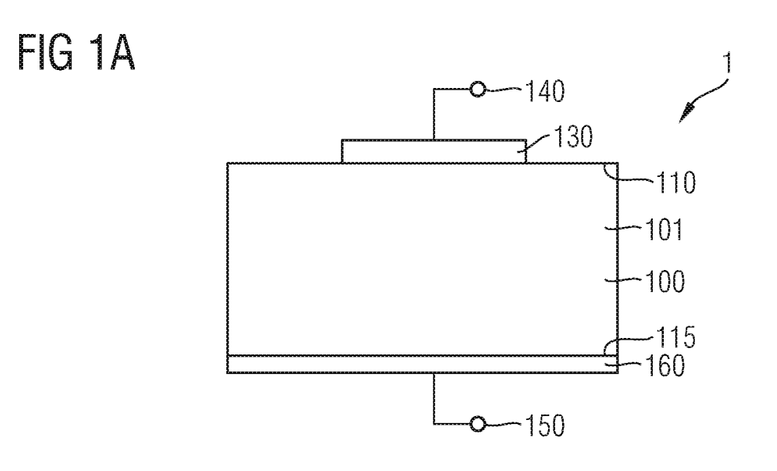
FIG. 1A illustrates a cross-sectional view of an example of a semiconductor device according to an embodiment.

FIG. 1A shows a cross-sectional view of a semiconductor device 1 according to an embodiment. The semiconductor device illustrated in FIG. 1A comprises a semiconductor material 100 and a contact layer 130 in contact with the semiconductor material 100. As will be explained in the following, the contact layer 130 comprises a metal nitride and a non-ohmic contact is formed between the semiconductor material 100 and the contact layer 130. A bandgap of the semiconductor material 100 is larger than 2 eV and less than 10 eV, e.g. less than 6 eV. According to a further embodiment, the bandgap of the semiconductor material may be larger than 0.9 or 1 eV and less than 10 eV.

The semiconductor material 100 may be a semiconductor body 101 including one or more doped portions or layers at either side thereof. The doped portion may be formed by various methods such as ion implantation, diffusion and epitaxial growth of the doped layer. For example, the semiconductor material may be a material having a bandgap larger than 1 eV. By way of example, the semiconductor material may comprise silicon carbide, diamond, gallium nitride, indium phosphide, AlGaAs and further examples of III-V semiconductors.

For example, the semiconductor body 101 may be heavily n-doped and may comprise a portion that is n-doped at a lower doping level, the portion being disposed at a first surface 110 of the semiconductor body. The contact layer 130 may comprise a combination of a stoichiometric compound with a non-stoichiometric compound including the metal and nitrogen. For example, the contact layer 130 may comprise mixture of $M_xN_y$ having different values for x and y, wherein M denotes the metal. For example, the metal nitride layer may comprise a mixture of MN and $M_xN_y$ or of $MN_2$ and $M_xN_y$. Generally, in these formulas, x may be equal to 1, and y may be a real number fulfilling $0<y<3$. Alternatively, y may be equal to 1, and x may be a real number fulfilling $0<x<3$. For example, the metal may be selected from the group of molybdenum, titanium, tantalum, and tungsten. Further, the metal nitride may comprise two metals, such as MoTiN.

The contact layer 130 may be electrically connected to an anode terminal. Further, the semiconductor device 1 may comprise a back side metallization 160 which forms an ohmic contact to the semiconductor body 101. The back side metallization 160 is disposed at a second surface 115 of the semiconductor body 101, opposite to the first surface 110. The back side metallization 160 may be electrically connected to a cathode terminal. The terms "ohmic contact", "Schottky contact", and "rectifying contact" will be explained below, while referring to FIGS. 2A and 2B.

Figure 1B:
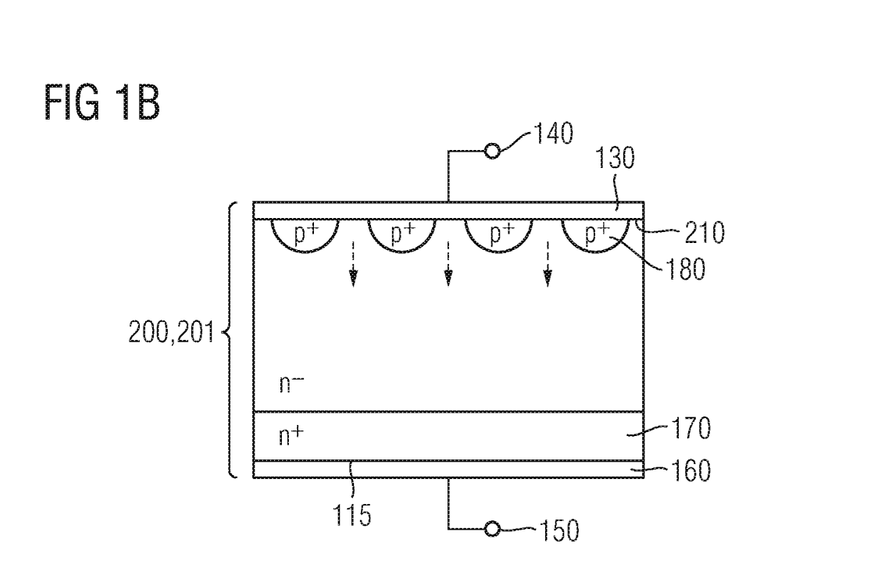
FIG. 1B shows a cross-sectional view of a semiconductor device according to a further embodiment.

FIG. 1B shows a further embodiment of a semiconductor device 1. The semiconductor device 1 illustrated in FIG. 1B comprises a semiconductor material 200, e.g. a semiconductor body 201 and a contact layer 130 in contact with the semiconductor material. The contact layer 130 comprises a metal nitride and a non-ohmic contact is formed between the semiconductor material 200 and the contact layer 130. Generally, the semiconductor material 200 may be a semiconductor body 201 including further doped portions. For example, these doped portions may be disposed adjacent to a first surface 210 or a second surface 215 of the semiconductor body 201. Differing from the embodiment of FIG. 1A, the semiconductor device 1 of FIG. 1B further comprises a doped region 180 of the second conductivity type. For example, the semiconductor material 200 may be n⁻-doped and the doped portion 180 may be p⁺-doped. The doped portion 180 may be disposed at the first surface 210 of the semiconductor body 201, and portions of the semiconductor material 200, which is e.g. n⁻-doped may be present at the first surface 210. The contact layer 130 may be in contact with the semiconductor material 200 and the doped portions 180. The semiconductor device 1 illustrated in FIG. 1B further comprises a heavily n⁺-doped region 170 at the second surface of the semiconductor body 201. The semiconductor device further comprises a back side metallization layer 160 that forms an ohmic contact to the doped layer 170. The back side metallization layer 160 may be electrically connected to a cathode terminal. The contact layer 130 may be electrically connected to an anode terminal. The semiconductor material may comprise any of the materials mentioned above. For example, the semiconductor material may be silicon carbide.

The semiconductor device illustrated in FIG. 1B may implement a Junction-Barrier Schottky (JBS) diode including p⁺ implanted portions 180. When a reverse voltage is applied to the semiconductor device, depletion regions formed at the interface between the n⁻ portion 200 and the p⁺ portion 180 pinch off a leakage current which may arise from the Schottky contact of the device. Accordingly, such a Junction-Barrier Schottky diode has a reduced leakage current. Such a JBS may be suitably used in a switched mode power supply.

Figure 1C:
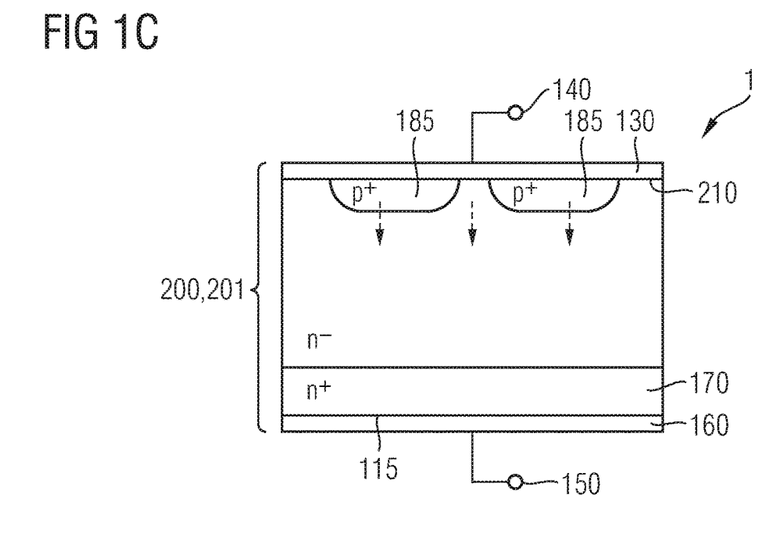
FIG. 1C shows a cross-sectional view of a semiconductor device according to a further embodiment.

According to a further embodiment, the semiconductor device 1 may implement a merged PIN Schottky diode (MPS). FIG. 1C shows a cross-sectional view of such a merged PIN Schottky-Diode. The MPS comprises similar components as the JBS, these components having the same reference numerals as the corresponding components of the JBS. In particular, the p⁺ portions 185 of the MPS are configured to inject minority carriers into the n⁻ portion 200 in a forward direction. For example the p⁺ portions 185 may be doped at a high doping concentration, e.g. $10^{19}$ to $10^{20}$ cm⁻³.

Figure 1D:
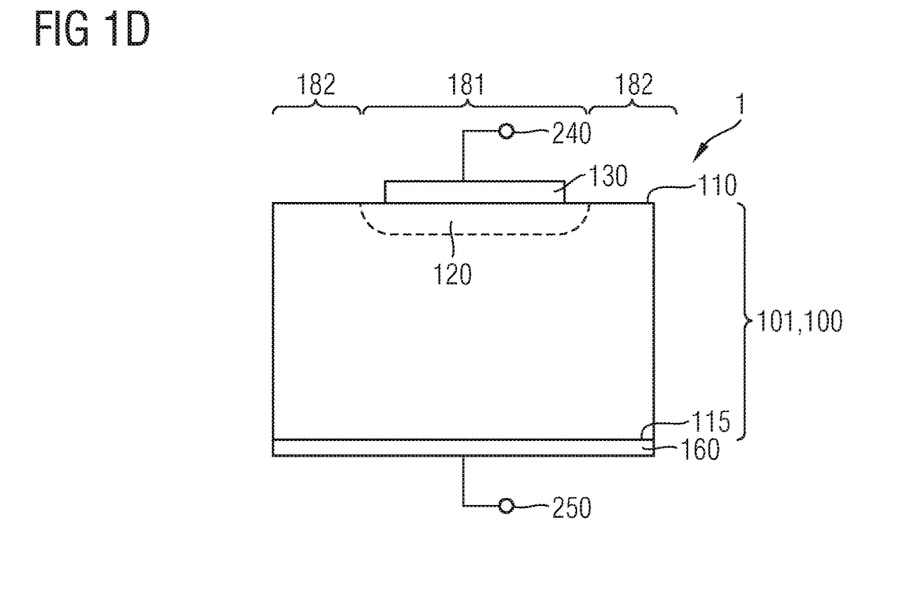
FIG. 1D shows a cross-sectional view of a semiconductor device according to a further embodiment.

FIG. 1D illustrates a further example of a semiconductor device. As is shown, the semiconductor device 1 comprises a semiconductor body 101 comprising a semiconductor material having a bandgap larger than 2 eV and less than 10 eV, a contact layer 130 in contact with a first surface 110 of the semiconductor body 101, the contact layer 130 comprising a metal nitride. The contact layer 130 is electrically connected to a first load terminal 240. A non-ohmic contact is formed between the semiconductor body 101 and the contact layer 130. A second surface 115 of the semiconductor body 101 is electrically connected to a second load terminal 250. The second surface 115 is opposite to the first surface 110.

For example, the contact layer 130 may be in contact with the doped portion 120. According to an embodiment, the semiconductor body 101 may be heavily n$^+$-doped and may be of an n-conductivity type. The doped portion 120 may be of an n-conductivity type, at a lower concentration of the n-type dopants.

For example, the semiconductor device shown in FIG. 1D may implement a Schottky-diode or a Schottky-diode related device. In this case, the first load terminal 240 may be an anode terminal, and the second load terminal 250 may be a cathode terminal. Depending from different implementations of the semiconductor device, the first load terminal 240 may be a source terminal and the second load terminal 250 may be a drain terminal, e.g. in the case of a MOSFET (metal oxide semiconductor field effect transistor) or a JFET (junction field effect transistor). According to a further example, the first load terminal 240 may be an emitter terminal, and the second load terminal 250 may be a collector terminal, e.g. in the case of an IGBT (insulated gate bipolar transistor).

The semiconductor device may comprise an active region 181 and a junction terminal area 182. In the active region 181, the contact layer 130 is in contact with the semiconductor body 101. The junction terminal area 182 is different from the active region 181 with regard to function and structure. To be more specific, in the active region 181, a load terminal of the semiconductor device, e.g. the anode terminal is electrically connected to the semiconductor body for the purpose of current conduction. In contrast, the purpose of the junction termination area is edge termination for reducing the electric field peak at the periphery of the semiconductor device 1. Typical structural elements of the junction termination area include one or more of field plates, ring structures such as floating guard rings or ring segments, junction termination extension (JTE) structures and variation of lateral doping (VLD) structures, for example.

Figure 2A:
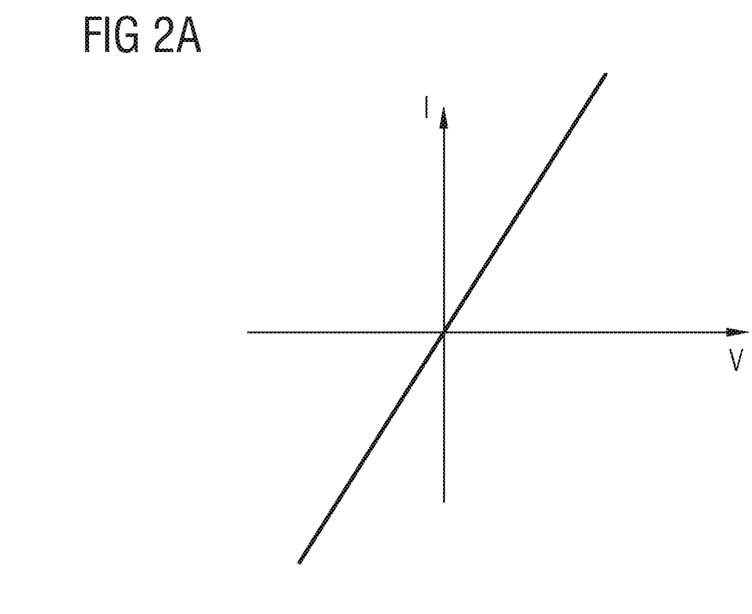
FIG. 2A illustrates an example of a current-voltage characteristic of an ohmic contact.

FIG. 2A shows an example of a current-voltage characteristic of an ohmic contact. As can be seen, the current is approximately proportional with respect to the applied voltage. The ratio of voltage and current is denoted as the resistance of the contact.

Figure 2B:
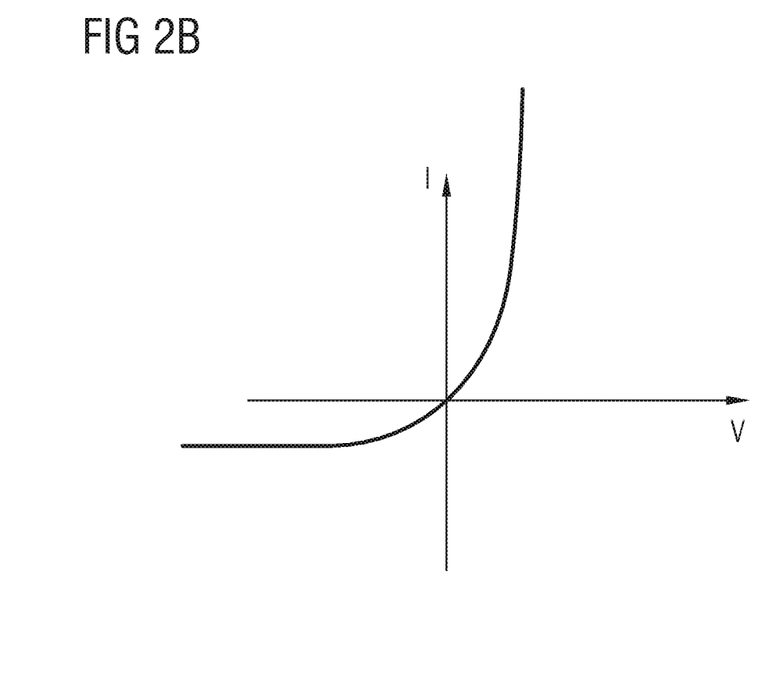
FIG. 2B illustrates a cross-sectional view of a rectifying contact.

On the other hand, as is illustrated in FIG. 2B, across a non-ohmic contact the current need not be proportional with respect to the voltage. Rather, as can be seen on the left-hand side of the chart illustrated in FIG. 2B, almost no current may be flowing, independent from the negative voltage applied. Further, when applying a positive voltage, the current may increase in a non-linear manner. Any kind of current-voltage characteristics in which the current is non-linear to the applied voltage, may be regarded as establishing a non-ohmic contact. For example, the contact may be a rectifying contact such as, for example, a pn junction or a Schottky junction, in which only a small current, i.e. the reverse saturation current flows, when a low voltage in a reverse direction is applied. When a higher voltage is applied in the reverse direction, a breakdown current may flow.

In the context of the present specification, the term "non-ohmic contact" is understood to represent any kind of contact having a non-linear current-voltage characteristics. According to a further modification, the term "rectifying contact" is considered to represent any kind of contact according to which only a little or no current flows, when a voltage in a reverse direction is applied, the current not being proportional with respect to the applied voltage.

Figure 3:
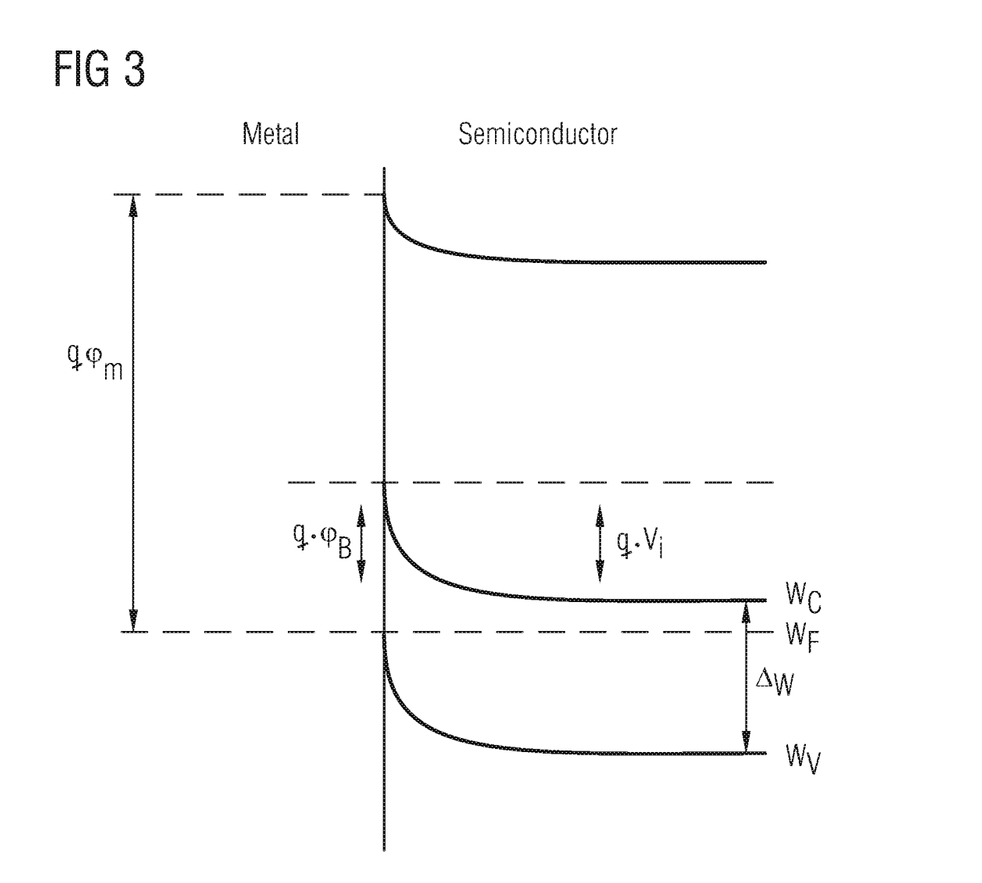
FIG. 3 illustrates an energy band diagram of a Schottky contact.

FIG. 3 shows an example of an energy band diagram of a rectifying metal semiconductor junction. The right-hand side of FIG. 3 shows the energy band diagram within the semiconductor material, wherein $W_C$ denotes the energy level of the conduction band, $W_V$ denotes the energy level of the valence band and $W_F$ denotes the Fermi level of the semiconductor material. The difference $\Delta W$ between the energy level $W_C$ of the conduction band and the energy level $W_V$ of the valence band denotes the bandgap of the semiconductor material. The left-hand portion of the energy band diagram of FIG. 3 shows the work function $q \times \varphi_M$ of the metal. When the metal and the semiconductor material form a junction, a potential barrier is generated at the interface between the Fermi level of the metal $W_F$ and the valence band of the semiconductor material. The height of the potential barrier $q \times \varphi_B$ also is referred to as the "Schottky barrier" of the contact.

Generally, Schottky contacts including a semiconductor material having a wide bandgap have a large forward voltage drop due to the work function and the Schottky barrier of the contact metals used. According to the described embodiment, by selecting a contact layer including a metal nitride, the height of the Schottky barrier may be adjusted. In particular, by varying the nitrogen content of the metal nitride, the work function of the metal may be suitably set. As a consequence, the Schottky barrier and hence, the forward voltage drop may be set by setting the nitrogen content of the metal nitride. For example, the nitrogen content of the metal nitride may be more than 10 atomic % and less than 50 atomic %, more specifically, from 38 to 45 atomic %. For example, the nitrogen content may be determined using Auger ion spectroscopy, secondary ion mass spectroscopy (SIMS) or X-Ray Photoelectron Spectroscopy (XPS).

The semiconductor device may be a semiconductor component which may be selected from the group consisting of a Schottky diode, a merged pn Schottky diode, a JFET, a MESFET, an integrated flyback diode, a rectifier, an inverter and a power supply.

Figure 4:
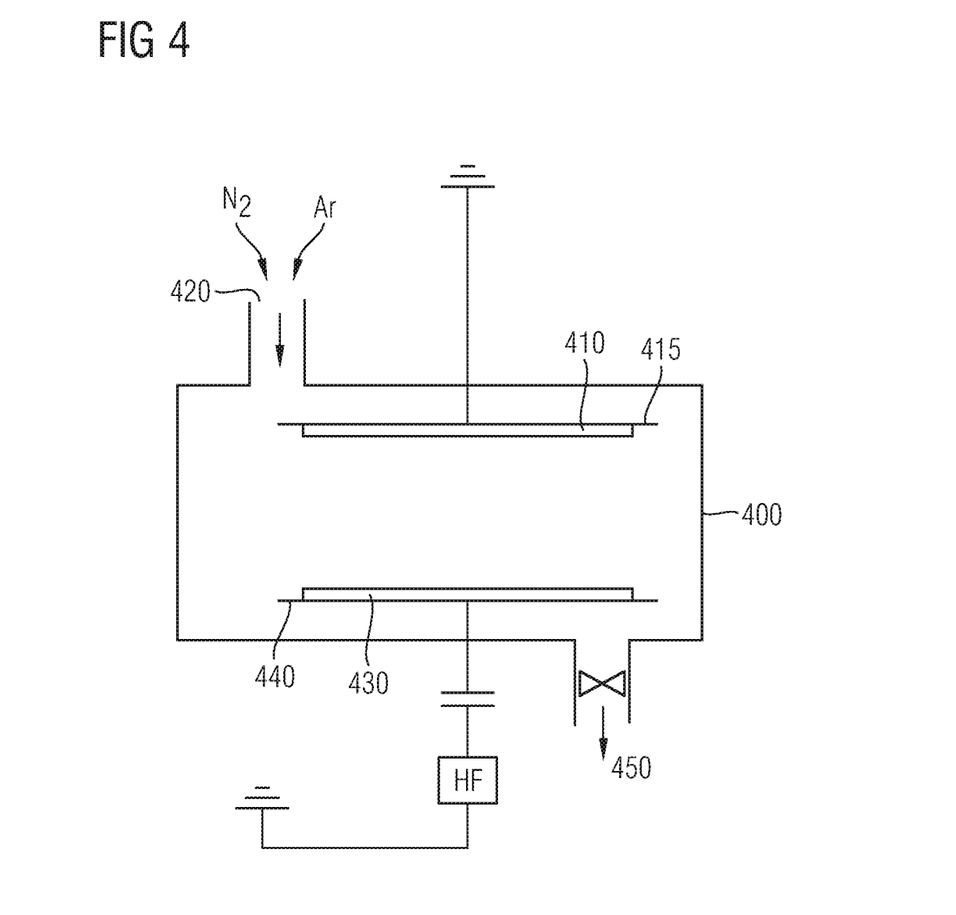
FIG. 4 illustrates an example of a reaction chamber which may be used for manufacturing the semiconductor device according to an embodiment.

FIG. 4 illustrates a reaction chamber of a sputter processing apparatus in which the contact layer comprising a metal nitride may be formed. A semiconductor substrate 430 may be disposed on a rotatable table 440. A sputter target 410 may be attached to a supporting element 415. The target may comprise the metal that forms the metal nitride. For example, the target may be made of a metal selected from the group consisting of molybdenum, titanium, tantalum, and tungsten. Further, the target 410 may comprise a combination of these metals. The chamber 400 comprises a gas inlet 420 through which a plasma forming inert gas such as argon may be fed into the reaction chamber. Further, nitrogen ($N_2$) may be fed via the inlet 420. After igniting a plasma nitrogen is a reactive gas which reacts with the atoms of the target 410. An electrical field as well as a magnetic field may be applied to the sputtering apparatus. Further details of the sputtering method are generally known.

According to an embodiment, by setting the partial pressure of nitrogen, the content of the nitrogen in the deposited metal nitride layer may be determined. It has been shown, that thereby the work function of the contact layer may be changed. For example, the barrier height of a $Mo_XN_Y$ metal in contact with a silicon carbide layer may be 0.94 eV to 1.12 eV. For example, the total pressure within the sputtering chamber may be 4 to 15 mTorr. The partial pressure of nitrogen ($N_2/(N_2+Ar)$) may be 0.1 to 1.0.

While embodiments of the invention have been described above, it is obvious that further embodiments may be implemented. For example, further embodiments may comprise any subcombination of features recited in the claims or any subcombination of elements described in the examples given above. This application is intended to cover any adaptations or variations of the specific embodiments discussed herein. Therefore, it is intended that this invention be limited only by the claims and the equivalents thereof.

What is claimed is:

1. A semiconductor device, comprising:
   a contact layer in contact with silicon carbide (SiC) material, the contact layer comprising a metal nitride having a nitrogen content in a range of 10 to 50 atomic %; and
   a non-ohmic contact formed between the SiC material and the contact layer.

2. The semiconductor device of claim 1, wherein the metal nitride comprises a combination of a stoichiometric compound with a non-stoichiometric compound including a metal and nitrogen.

3. The semiconductor device of claim 1, wherein the metal nitride comprises a metal selected from the group consisting of molybdenum, titanium, tantalum, and tungsten.

4. The semiconductor device of claim 1, wherein the non-ohmic contact is a Schottky contact.

5. The semiconductor device of claim 1, wherein the non-ohmic contact is a rectifying contact.

6. The semiconductor device of claim 1, wherein the SiC material is a SiC body including one or more doped portions or layers at either side of the SiC body.

7. The semiconductor device of claim 6, wherein the SiC body is heavily n-doped and comprises a portion that is n-doped at a lower doping level, the portion being disposed at a first surface of the SiC body, and wherein the contact layer is in contact with the portion disposed at the first surface of the SiC body.

8. The semiconductor device of claim 1, wherein the metal nitride comprises a mixture of MN and $M_xN_y$, or of $MN_2$ and $M_xN_y$, and wherein x equals 1 and y is a real number fulfilling $0 < y < 3$, or y equals 1 and x is a real number fulfilling $0 < x < 3$.

9. The semiconductor device of claim 1, wherein the metal nitride comprises two metals.

10. The semiconductor device of claim 9, wherein the metal nitride comprises MoTiN.

11. An electrical component comprising the semiconductor device of claim 1, wherein the electrical component is selected from the group consisting of a Schottky diode, a merged pn Schottky diode, a JFET, a MESFET, an integrated flyback diode, a rectifier, an inverter, and a power supply.

12. A semiconductor device, comprising:
    a silicon carbide (SiC) body;
    a contact layer in contact with a first surface of the SiC body, the contact layer comprising a metal nitride having a nitrogen content in a range of 10 to 50 atomic %;
    a first load terminal electrically connected to the contact layer;
    a non-ohmic contact formed between the SiC body and the contact layer; and
    a second load terminal electrically connected to a second surface of the SiC body, the second surface being opposite to the first surface.

13. The semiconductor device of claim 12, further comprising a doped portion in contact with the contact layer, the doped portion being embedded in the SiC body and having a conductivity type opposite to a conductivity type of the SiC body.

14. The semiconductor device of claim 13, wherein the SiC body is n- doped and the doped portion is p+ doped.

15. The semiconductor device of claim 13, wherein the doped portion extends to the first surface of the SiC body, and wherein portions of the SiC body present at the first surface laterally adjoin the doped portion.

16. The semiconductor device of claim 12, further comprising a back side metallization in ohmic contact with the SiC body at the second surface of the SiC body, wherein the back side metallization is electrically connected to the second load terminal, wherein the second load terminal is a cathode terminal, and wherein the first load terminal is an anode terminal.

17. The semiconductor device of claim 12, further comprising a plurality of p+ implanted portions extending to the first surface of the SiC body, wherein neighboring ones of the p+ implanted portions are laterally separated from one another by an n- portion of the SiC body, and wherein the semiconductor device is a junction-barrier Schottky diode configured such that depletion regions formed at an interface between the n⁻ portion and the p⁺ implanted portions pinch off a leakage current which arises from the non-ohmic contact formed between the SiC body and the contact layer.

18. The semiconductor device of claim 12, further comprising a plurality of p+ implanted portions extending to the first surface of the SiC body, wherein neighboring ones of the p+ implanted portions are laterally separated from one another by an n- portion of the SiC body, and wherein the semiconductor device is a merged PIN Schottky diode configured such that the p+ implanted portions are configured to inject minority carriers into the n- portion in a forward direction.

19. The semiconductor device of claim 12, further comprising a doped portion in contact with the contact layer, the doped portion being embedded in the SiC body and having a same conductivity type as the SiC body, and wherein the SiC body is doped more heavily than the doped portion.

20. The semiconductor device of claim 12, wherein the contact layer is in contact with the SiC body and the first load terminal is electrically connected to the SiC body in an active region of the semiconductor device, and wherein in a junction termination area an edge termination is provided for reducing an electric field peak at a periphery of the semiconductor device.

* * * * *

UNITED STATES PATENT AND TRADEMARK OFFICE
CERTIFICATE OF CORRECTION

PATENT NO. : 10,431,698 B2
APPLICATION NO. : 16/238213
DATED : October 1, 2019
INVENTOR(S) : J. Konrath et al.

Page 1 of 1

It is certified that error appears in the above-identified patent and that said Letters Patent is hereby corrected as shown below:

In the Claims

Column 8, Line 33 (Claim 17), please change "n⁻portion and the p+implanted" to -- $n^-$ portion and the $p^+$ implanted --.

Signed and Sealed this
Third Day of December, 2019

Andrei Iancu
*Director of the United States Patent and Trademark Office*